US009029855B2

(12) United States Patent
Ning et al.

(10) Patent No.: US 9,029,855 B2
(45) Date of Patent: May 12, 2015

(54) LAYOUT FOR RETICLE AND WAFER SCANNING ELECTRON MICROSCOPE REGISTRATION OR OVERLAY MEASUREMENTS

(71) Applicants: Guo Xiang Ning, Ballston Lake, NY (US); Carsten Hartig, Meerane (DE); Paul Ackmann, Gansevoort, NY (US); Fanghong Gn, Singapore (SG)

(72) Inventors: Guo Xiang Ning, Ballston Lake, NY (US); Carsten Hartig, Meerane (DE); Paul Ackmann, Gansevoort, NY (US); Fanghong Gn, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/835,147

(22) Filed: Mar. 15, 2013

(65) Prior Publication Data

US 2014/0264334 A1 Sep. 18, 2014

(51) Int. Cl.
*H01L 23/58* (2006.01)
*H01L 21/66* (2006.01)
*H01L 21/768* (2006.01)
*G03F 7/20* (2006.01)

(52) U.S. Cl.
CPC .............. *H01L 22/32* (2013.01); *H01L 21/768* (2013.01); *G03F 7/70616* (2013.01); *H01L 22/30* (2013.01)

(58) Field of Classification Search
CPC ...... H01L 23/544; H01L 21/682; H01L 21/68; H01L 22/32; H01L 21/768; G03F 7/70633; G03F 7/70616
USPC ...................................... 438/401; 257/48, 797
See application file for complete search history.

(56) References Cited

U.S. PATENT DOCUMENTS 5,869,906 A * 2/1999 Narimatsu .................... 257/797
2013/0157389 A1 * 6/2013 Wang et al. .................... 438/14

* cited by examiner

*Primary Examiner* — Benjamin Sandvik
*Assistant Examiner* — Farid Khan
(74) *Attorney, Agent, or Firm* — Ditthavong & Steiner, P.C.

(57) ABSTRACT

A method and a resulting device are provided for forming stack overlay and registration monitoring structures for FEOL layers including implant layers and for forming BEOL SEM overlay and registration monitoring structures including BEOL interconnections, respectively. Embodiments include forming an active monitoring structure having first and second edges separated by a first distance in an active layer on a semiconductor substrate; forming a poly monitoring structure having first and second edges separated by a second distance in a poly layer; and forming one or more contact monitoring structures in a contact layer, collectively exposing at least the first and second edges of each of the active and poly monitoring structures; wherein the active, poly, and contact monitoring structures are formed in an area which includes no IC patterns in the active, the poly, and the contact layers, respectively.

12 Claims, 8 Drawing Sheets

LAYOUT FOR RETICLE AND WAFER SCANNING ELECTRON MICROSCOPE REGISTRATION OR OVERLAY MEASUREMENTS

TECHNICAL FIELD

The present disclosure relates to semiconductor devices including interconnects that require two-dimensional (2D) registration measurement or overlay reticle measurement. The present disclosure is particularly applicable to 45 nanometer (nm) and below technology nodes, but it is also applicable to all technology nodes.

BACKGROUND

There is a demand for structures that can be evaluated by a critical dimension scanning electron microscope (CDSEM) (or even atomic force microscopy (AFM) to some extent) on a wafer and still be verified on the mask with today's mask metrology. However, this is only possible if the dimensions and the appearance of the structures are compatible with current CDSEM measurement approaches and if the relevant reference layer can be exposed and dimensions of the underlying layer can be assessed during the measurement of the current layer. Such evaluations are particularly problematic for interconnects due to limited visibility of buried layers. Currently, for 45 nm and below technology nodes there are micro-blossom targets or process control images (PCIs) for reticle registration measurement. However, micro-blossom targets cannot provide 2D registration measurements or provide the wafer CDSEM overly measurement and, at the same time, enable monitoring of interconnections.

A need therefore exists for methodology enabling 2D registration measurement or overlay reticle measurement and monitoring of interconnections and SEM overlay measurements and the devices used for such methodology.

SUMMARY

An aspect of the present disclosure is a method of forming stack overlay and registration monitoring structures for front-end-of-line (FEOL) layers including implant layers and a method of forming back-end-of-line (BEOL) SEM overlay and registration monitoring structures including BEOL interconnections.

Another aspect of the present disclosure is a device including overlay and registration monitoring structures for FEOL layers including implant layers and a device including BEOL SEM overlay and registration monitoring structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an active monitoring structure having first and second edges separated by a first distance in an active layer on a semiconductor substrate; forming a polysilicon (poly) monitoring structure having first and second edges separated by a second distance in a poly layer; and forming one or more contact monitoring structures in a contact layer, collectively exposing at least the first and second edges of each of the active and poly monitoring structures; wherein the active, poly, and contact monitoring structures are formed in an area which includes no integrated circuit (IC) patterns in the active, the poly, and the contact layers, respectively.

Aspects of the present disclosure include the first and second distances are in different directions; the one or more contact monitoring structures comprise at least first, second, and third contact monitoring structures; the first and second contact monitoring structures expose the first and second edges of the active monitoring structure; and the second and third contact monitoring structures expose the first and second edges of the poly monitoring structure.

Further aspects include forming a second active monitoring structure in the active layer on a semiconductor substrate; and forming a second poly monitoring structure in the poly layer, wherein one of the first, second, and third contact monitoring structures exposes one of the first and second edges of each of the first active and first poly monitoring structures and exposes a first edge of each of the second active and second poly monitoring structures. Additional aspects include forming a fourth contact monitoring structure in the contact layer, exposing a second edge of the second active monitoring structure, opposite the first edge; and forming a fifth contact monitoring structure in the contact layer, exposing a second edge of the second poly monitoring structure, opposite the first edge. Another aspect includes forming a plurality of implant monitoring structures in an implant layer on the semiconductor substrate in an area which includes no IC patterns in the implant layer, wherein a first implant monitoring structure having first, second, third, and fourth edges is formed on top of either the active monitoring structure or the poly monitoring structure, and the first, second, third, and fourth edges are all exposed. An additional aspect includes the second distance being less than and in the same direction as the first distance; the active monitoring structure has third and fourth edges separated by a third distance in a third direction different than the first direction; the poly monitoring structure has third and fourth edges separated by a fourth distance less than and in the same direction as the third distance; and one contact monitoring structure exposes the first, second, third, and fourth edges of the active monitoring structure and first, second, third, and fourth edges of the poly monitoring structure Another aspect of the present disclosure is a device including: a semiconductor substrate; an active layer including an active monitoring structure having first and second edges separated by a first distance; a poly layer including a poly monitoring structure having first and second edges separated by a second distance; and a contact layer including one or more contact monitoring structures, collectively exposing at least the first and second edges of each of the active and poly monitoring structures, wherein the active monitoring structure, the poly monitoring structure, and the first, second, and third contact monitoring structures are in an area which includes no IC pattern in the active, the poly, and the contact layers, respectively.

Aspects of the device include the active monitoring structure having first and second edges separated by the first distance in a first direction; the poly monitoring structure having first and second edges separated by the second distance in a second direction that is different than the first direction; the contact layer including at least first, second, and third contact monitoring structures, wherein the first and second contact monitoring structures expose the first and second edges of the active monitoring structure and the second and third contact monitoring structures expose the first and second edges of the poly monitoring structure. Further aspects include a second active monitoring structure in the active layer on a semiconductor substrate; and a second poly monitoring structure in the poly layer, wherein one of the first, second, and third contact monitoring structures exposes one of the first and second edges of each of the first active and first poly monitoring structures and exposes a first edge of each of the second active and second poly monitoring structures. Additional aspects include a fourth contact monitoring structure in the contact layer, exposing a second edge of the second active monitoring structure, opposite the first edge; and a fifth contact monitoring structure in the contact layer, exposing a second edge of the second poly monitoring structure, opposite the first edge Another aspect includes a plurality of implant monitoring structures in an implant layer on the semiconductor substrate in an area which includes no IC patterns in the implant layer, wherein a first implant monitoring structure having first, second, third, and fourth edges is formed on top of either the active monitoring structure or the poly monitoring structure and the first, second, third, and fourth edges are all exposed. An additional aspect includes the active, poly, and contact monitoring structures having one or more convex polygonal shapes.

An additional aspect of the present disclosure is a method including: forming an initial metal monitoring structure having a first portion having first and second edges separated by a first distance in a first direction, the initial metal monitoring structure being formed in an initial metal layer of a semiconductor substrate; forming a subsequent metal monitoring structure having a first portion having first and second edges separated by a second distance in the first direction, the subsequent metal monitoring structure being formed in a subsequent metal layer adjoining the initial metal layer; and forming a via within the first portion of the subsequent metal monitoring structure, the via exposing the first and second edges of the first portion of the initial metal monitoring structure, wherein the initial and the subsequent monitoring structures are formed in an area which includes no integrated IC patterns in the initial metal layer and the subsequent metal layer, respectively Aspects of the present disclosure include forming each of the initial metal monitoring structure and the subsequent metal monitoring structure having a second portion, wherein the a part of the second portion of the subsequent metal monitoring structure overlays a part of the second portion of the initial metal monitoring structure. Further aspects include the first and second portions of the initial metal monitoring structure extending perpendicularly to the first and second portions of the subsequent metal monitoring structure, respectively. Additional aspects include forming each of the initial and the subsequent metal monitoring structures in a cross shape by: forming the initial metal monitoring structure having: a second portion having third and fourth edges separated by a third distance in a second direction, a third portion having fifth and sixth edges separated by a fourth distance in the first direction, and a fourth portion having seventh and eighth edges separated by a fifth distance in the second direction; and forming the subsequent metal monitoring structure having: a second portion having third and fourth edges separated by a sixth distance in the second direction, the sixth distance being greater than the third distance, a third portion having fifth and sixth edges separated by a seventh distance in the first direction, the seventh distance being less than the fourth distance, and a fourth portion having seventh and eighth edges separated by an eighth distance in the second direction, the eighth distance being less than the fifth distance. Another aspect includes forming a second via within the second portion of the subsequent metal monitoring structure, exposing the third and fourth edges of the second portion of the initial metal monitoring structure.

A further aspect of the present disclosure is a device including: a semiconductor substrate; an initial metal layer including an initial metal monitoring structure having a first portion having first and second edges separated by a first distance in a first direction; a subsequent metal layer, adjoining the initial metal layer and including a subsequent metal monitoring structure having a first portion having first and second edges separated by a second distance in the first direction; and a via through the subsequent metal monitoring structure and within the first portion of the subsequent metal monitoring structure, the via exposing the first and second edges of the first portion of the initial metal monitoring structure, wherein the initial metal monitoring structure and the subsequent metal monitoring structure are in an area which includes no IC pattern in the one or more initial metal layers and the one or more subsequent metal layers, respectively Aspects include the initial metal monitoring structure and the subsequent monitoring structure having a second portion, wherein a part of the second portion of the subsequent metal monitoring structure overlays a part of the second portion of the initial metal monitoring structure. Other aspects include the first and second portions of each of the initial and subsequent metal monitoring structures extending perpendicularly to the first and second portions of the subsequent metal monitoring structure, respectively. Further aspects include wherein each of the initial and the subsequent metal monitoring structures is formed in a cross shape wherein: the initial metal monitoring structure has: a second portion having third and fourth edges separated by a third distance in a second direction, a third portion having fifth and sixth edges separated by a fourth distance in the first direction, and a fourth portion having seventh and eighth edges separated by a fifth distance in the second direction; and the subsequent metal monitoring structure has: a second portion having third and fourth edges separated by a sixth distance in the second direction, the sixth distance being greater than the third distance, a third portion having fifth and sixth edges separated by a seventh distance in the first direction, the seventh distance being less than the fourth distance, and a fourth portion having seventh and eighth edges separated by an eighth distance in the second direction, the eighth distance being less than the fifth distance. Additional aspects include a second via within the second portion of the subsequent metal monitoring structure, exposing the third and fourth edges of the second portion of the initial metal monitoring structure.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an inability to evaluate and verify by CDSEM (or AFM) registration and overlay structures, on a wafer and on a lithographic mask, attendant upon forming and employing the lithographic mask with current mask metrology. In accordance with embodiments of the present disclosure, overlapping monitoring structures are used for registration and overlay measurements.

Methodology in accordance with embodiments of the present disclosure includes forming an active monitoring structure having first and second edges separated by a first distance in an active layer on a semiconductor substrate. A poly monitoring structure having first and second edges separated by a second distance is formed in a poly layer. One or more contact monitoring structures are formed in a contact layer, collectively exposing at least the first and second edges of each of the active and poly monitoring structures, wherein the active, poly, and contact monitoring structures are formed in an area which includes no integrated circuit (IC) patterns in the active, the poly, and the contact layers, respectively.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
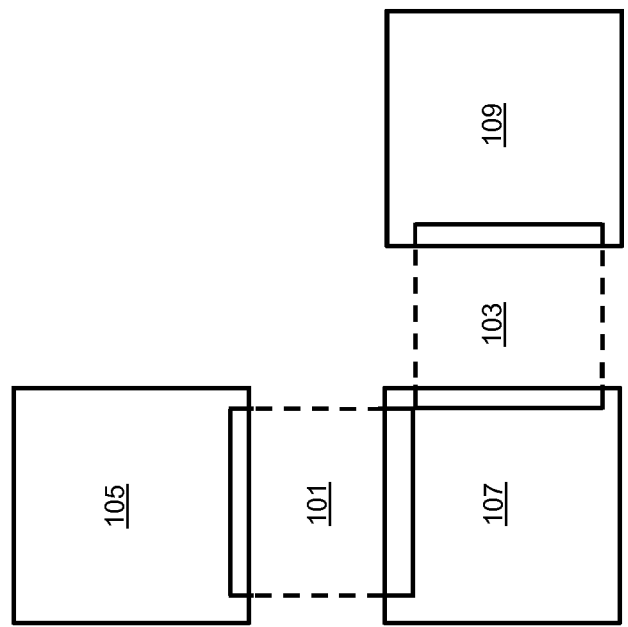
FIGS. 1A, 2, and 3A schematically illustrate registration/overlay marks for active, poly, and contact layers, in one direction for FIG. 1A and in two directions for FIGS. 2 and 3A, in accordance with an exemplary embodiment.

Adverting to FIG. 1A, an active monitoring structure 101 having first and second edges separated by a first distance is formed in an active layer on a semiconductor substrate, in an area which does not include IC patterns. A poly monitoring structure 103 having first and second edges separated by a second distance is then formed in a poly layer on the semiconductor substrate, e.g., diagonally aligned with and proximate to the active monitoring structure 101. Similar to the active monitoring structure 101, the poly monitor structure 103 is formed in an area which does not include IC patterns. Thereafter, a first contact monitoring structure 105 is formed in a contact layer on the semiconductor substrate exposing one of the first and second edges of the active monitoring structure 101. A second monitoring structure 107 is formed in the contact layer exposing a second edge of the active monitoring structure 101, opposite the first edge, and one of the first or second edges of the poly monitoring structure 103. Also in the contact layer, a third contact monitoring structure 109 is formed so that the third contact monitoring structure 109 exposes a second edge of the poly monitoring structure 103, opposite the first edge. In general, only the portions of the active monitoring structure 101 and the poly monitoring structure 103 within the first, second, and third contact monitoring structures 105, 107, and 109 are visible as depicted by the solid lines. In addition, the first contact monitoring structure 105, the second contact monitoring structure 107, and the third contact monitoring structure 109 are all formed in an area that does not include IC patterns. More specifically, FIG. 1A shows the SEM registration or overlay layout for active, poly, and contact layers in one direction. Further, although illustrated as squares, monitoring structures 101 through 109 may alternatively be formed as one or more convex polygonal shapes.

Figure 1C:
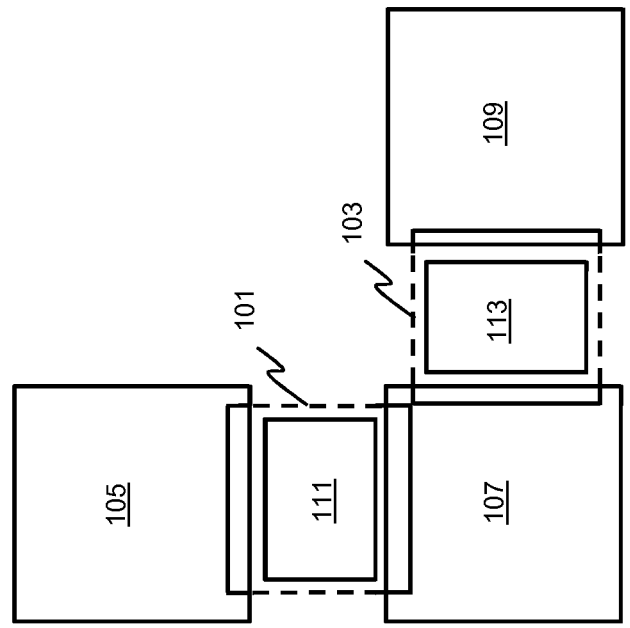
FIGS. 1B, 1C, 1D, 1E, and 3B schematically illustrate registration/overlay marks for active, poly, contact, and implant layers, in one and two directions, respectively, in accordance with an exemplary embodiment.
Figure 1B:
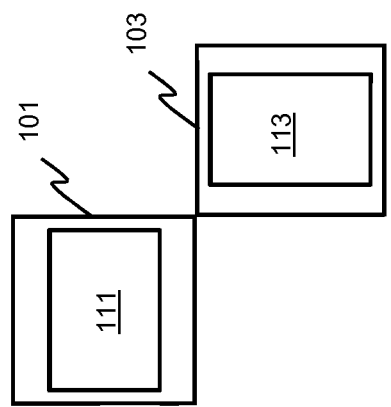

For 45 nm technology nodes and beyond, the implant layer to active layer SEM overlay measurement is important for both the reticle and the wafer. A first and a second implant monitoring structure 111 and 113, respectively, each having first, second, third, and fourth edges may be formed in an implant layer on the semiconductor substrate in an area that does not include IC patterns, as illustrated in FIG. 1B. Moreover, the first and second implant monitoring structures 111 and 113 may be formed overlying and within the active monitoring structure 101 or the poly monitoring structure 103, respectively, and the first, second, third, and fourth edges are all exposed. Adverting to FIG. 1C, the first, second, and third contact monitoring structures 105, 107, and 109 may then be formed as in FIG. 1A so that the first implant monitoring structure 111 is between the first contact monitoring structure 105 and the second contact monitoring structure 107 and the second implant monitoring structure 113 is between the second contact monitoring structure 107 and the third contact monitoring structure 109. The overlay measurements for the implant monitoring structures 111 and 113 can be obtained in both the X and the Y direction for both reticle and wafer CDSEM.

Figure 1D:
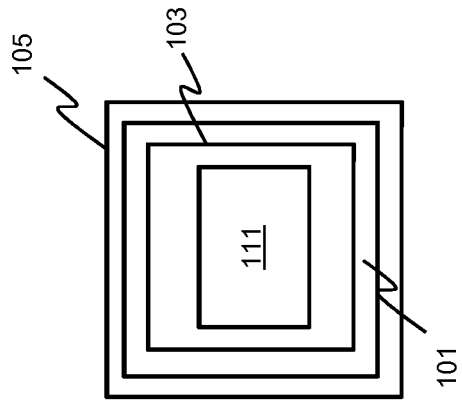

Alternatively, as illustrated in FIG. 1D, the active monitoring structure 101 having first and second edges separated by a first distance may be formed in the active layer of the semiconductor substrate, in an area which does not include IC patterns. The poly monitoring structure 103 having first and second edges separated by a second distance less than the first distance but in the same direction as the first distance may then be formed in the poly layer on the semiconductor substrate, over the active monitoring structure, such that the first and second edges of the active monitoring structure 101 are not obscured by the poly monitoring structure 103. In addition, the active monitoring structure 101 has third and fourth edges separated by a third distance in a second direction different than the first distance, and the poly monitoring structure has third and fourth edges separated by a fourth distance less than the third distance in the second directions, such that the third and fourth edges of the active monitoring structure are not obscured by the poly monitoring structure. Thereafter, the first contact monitoring structure 105 is formed in a contact layer on the semiconductor substrate, over the poly monitoring structure. The first contact monitoring element is sized such that distances between opposite edges in the first and second directions are greater than the first and third distances, respectively, between opposite edges of the active monitoring structure. Further, the first contact monitoring structure 105 is formed such that it exposes the first, second, third, and fourth edges of both the active monitoring structure 101 and the poly monitoring structure 103.

Figure 1E:
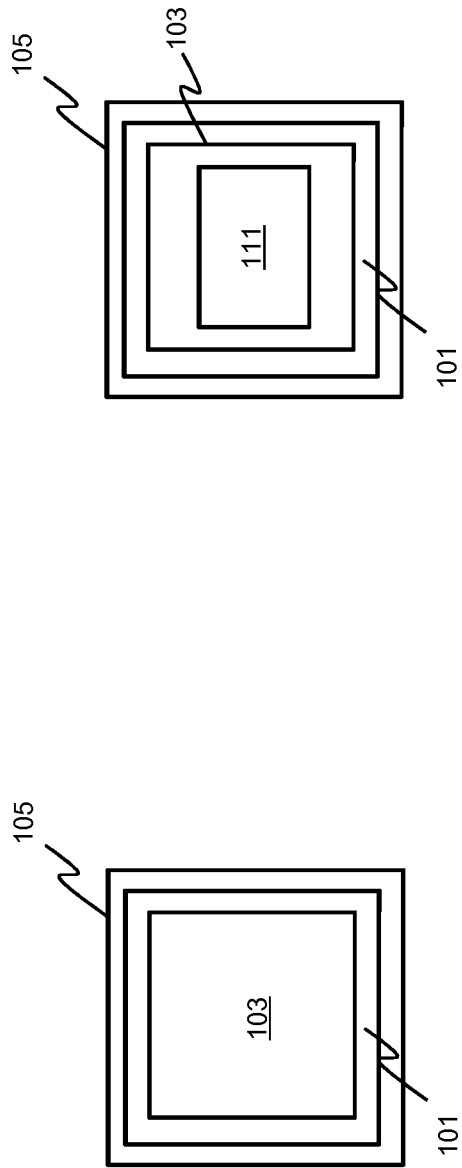

As illustrated in FIG. 1E, the implant monitoring structure 111 having first, second, third, and fourth edges may be formed within the boundaries of the first, second, third, and fourth edges of poly monitoring structure 103 in FIG. 1D. Thereafter, when the first contact monitoring structure 105 is formed, first, second, third, and fourth edges of the implant monitoring structure 111 are exposed in addition to the first, second, third, and fourth edges of the active monitoring structure and the poly monitoring structure. As in FIG. 1D, the active monitoring structure 101, the poly monitoring structure 103, contact monitoring structure 105, and the implant monitoring structure 111, are formed in an area which includes no IC patterns in the active, the poly, the implant, and the contact layers, respectively.

Figure 2:
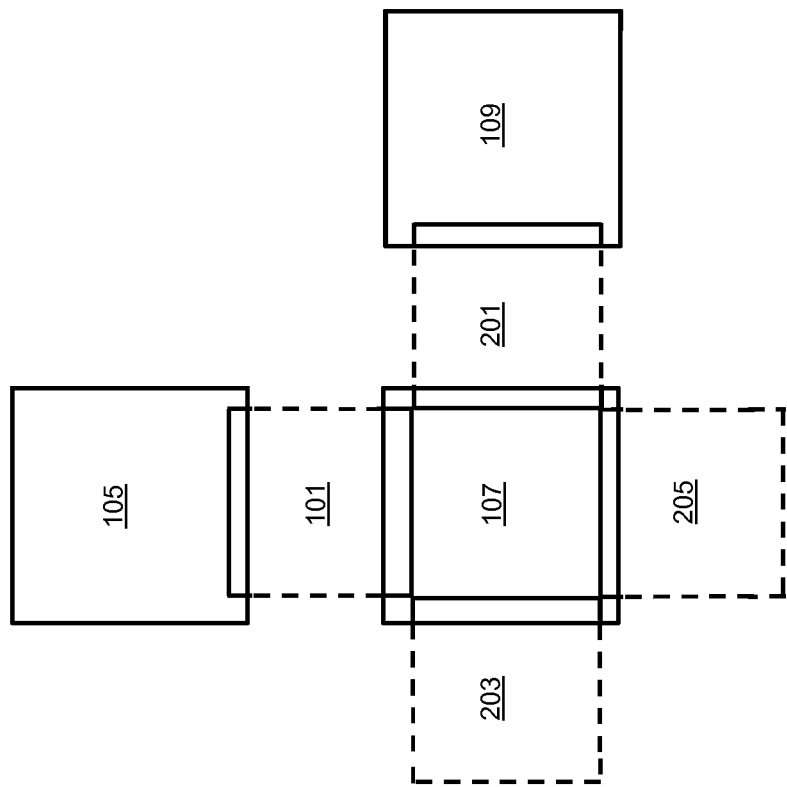

Adverting to FIG. 2, a second active monitoring structure 201 may be formed in the same manner as the active monitoring structure 101, instead of the poly monitoring structure 103. In other words, the second active monitoring structure 201 may be formed diagonal and proximate to the active monitoring structure 101. Next, similar to the poly monitoring structure 103, a poly monitoring structure 203 may be formed in the poly layer of the semiconductor substrate in an area that does not include IC patterns. In particular, the poly monitoring structure 203 may be formed diagonal and proximate to the active monitoring structure 101 and aligned horizontally with the active monitoring structure 201. A second poly monitoring structure 205 may be formed in the same manner as the poly monitoring structure 203, but diagonally aligned with and proximate to both the poly monitoring structure 203 and the second active monitoring structure 201. Thereafter, the first, second, and third contact monitoring structures 105, 107, and 109 may be formed as in FIG. 1A. However, the first, second, and third contact monitoring structures 105, 107, and 109 expose one of the first and second edges of the first active and first poly monitoring structures 101 and 103, respectively, and expose a first edge of each of the second active and second poly monitoring structures 201 and 203, respectively. Again, only portions of the active monitoring structures 101 and 201 and the poly monitoring structures 203 and 205 within the first, second, and third contact monitoring structures 105, 107, and 109 are visible as depicted by the solid lines. Further, although illustrated as squares, monitoring structures 201 through 205 may alternatively be formed as one or more convex polygonal shapes.

Figure 3A:
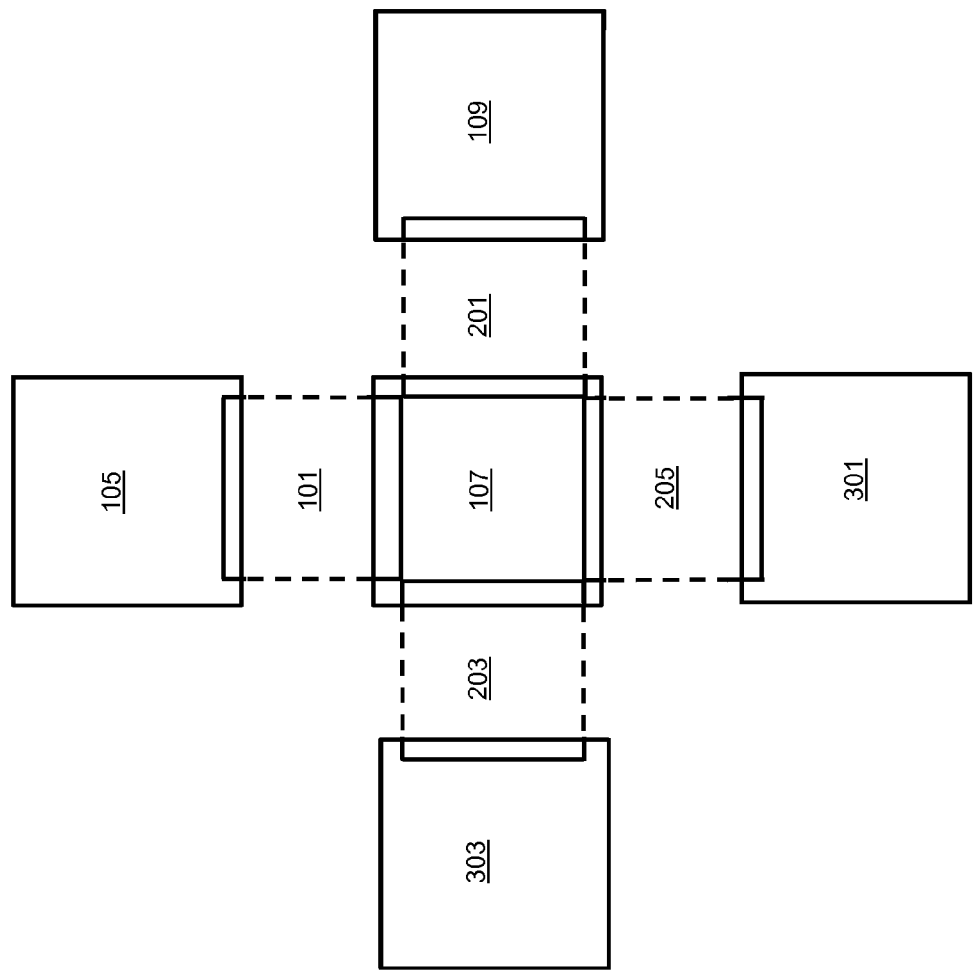

When there is sufficient space in the contact layer, a fourth contact monitoring structure 301 may be formed in the same manner as the first contact monitoring structure 105, as illustrated in FIG. 3A. More specifically, the fourth contact monitoring structure 301 exposes a second edge of the second active monitoring structure 201, opposite the first edge. In addition, a fifth contact monitoring structure 303 may be formed in the same manner as the first contact monitoring structure 105, but the fifth contact monitoring structure 303 exposes a second edge of the second poly monitoring structure 203, opposite the first edge. Again, although illustrated as squares, monitoring structures 301 and 303 may alternatively be formed as one or more convex polygonal shapes.

Figure 3B:
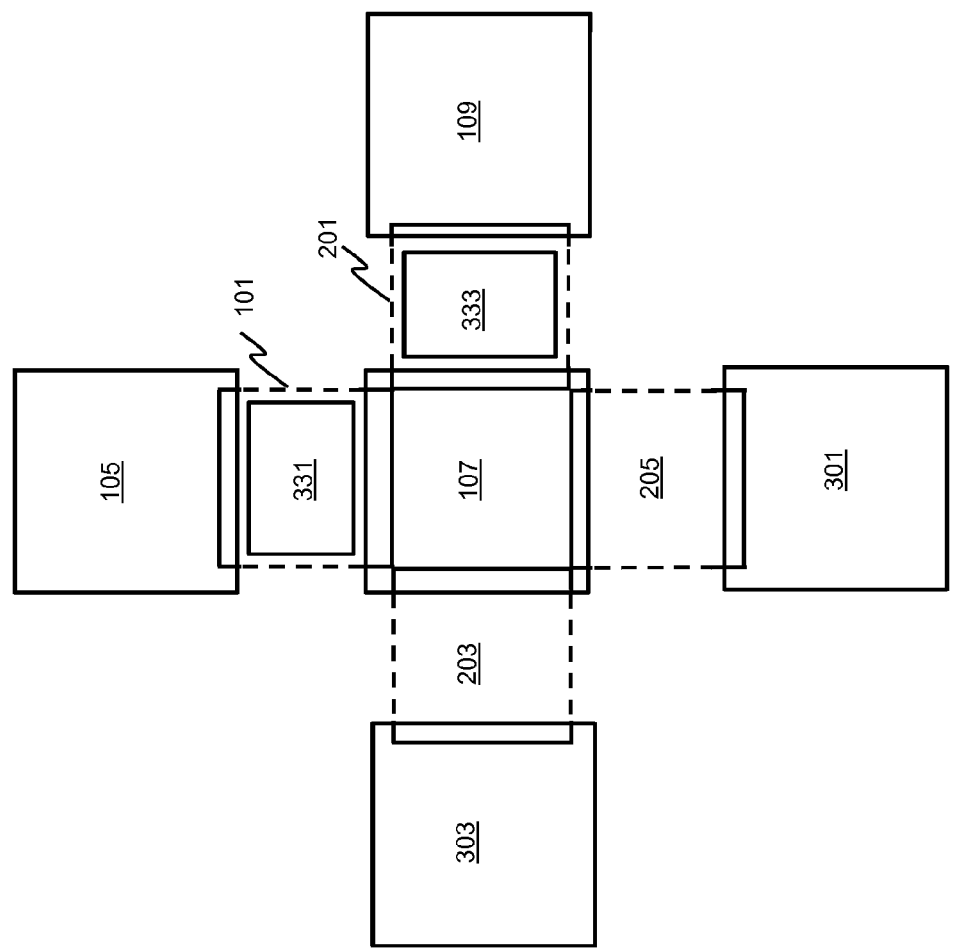

Adverting to FIG. 3B, a first implant monitoring structure 331 and a second implant monitoring structure 333 similar to the first and second implant monitoring structures 111 and 113 of FIG. 1B may be formed in the implant layer on the semiconductor substrate in an area that does not include IC patterns. In particular, the first and second implant monitoring structures 331 and 333 may be formed overlying and within the active monitoring structure 101 and the second active monitoring structure 201, respectively, so that the first, second, third, and fourth edges of each implant monitoring structures 331 and 333 are all exposed. Thereafter, the first, second, third, fourth, and fifth contact monitoring structures 105, 107, 109, 301, and 303 are formed as in FIG. 3A.

Figure 4:
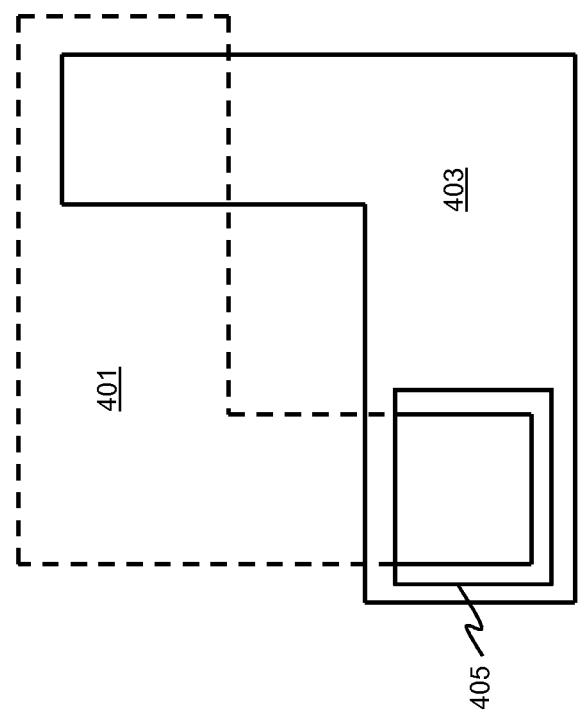
FIGS. 4 and 5 schematically illustrate registration/overlay marks for two consecutive metal layers, in one and two directions, respectively, in accordance with an exemplary embodiment.

Adverting to FIG. 4, an overlay and registration monitoring structure for metal interconnect layers is illustrated. An initial metal monitoring structure 401 having first and second edges separated by a first distance in a first direction and a second portion, is formed in an initial metal layer of a semiconductor substrate, in an area that does not include IC patterns. A subsequent metal monitoring structure 403, also having a first portion having first and second edges separated by a second distance in the first direction and a second portion, is formed in a subsequent metal layer adjoining the initial metal layer, in an area that does not include IC patterns. More specifically, the subsequent metal monitoring structure 403 is formed such that a part of the second portion of the subsequent metal monitoring structure 403 overlays a part of the second portion of the initial metal monitoring structure 401, and wherein the first and second portions of the initial metal monitoring structure 401 extend perpendicular to the first and second portions of the subsequent metal monitoring structure 403, respectively. Next, a via 405 is formed within the first portion of the subsequent metal monitoring structure 403, the via 405 exposing the first and second edges of the first portion of the initial metal monitoring structure 401. More specifically, similar to FIG. 1A, only portions of the initial metal monitoring structure 401 within the boundaries of the via 405 are visible as depicted by the solid lines. This process flow may be repeated for each two consecutively formed metal layers on the semiconductor substrate. The structure of FIG. 4 enables overlay and registration monitoring in one direction.

Figure 5:
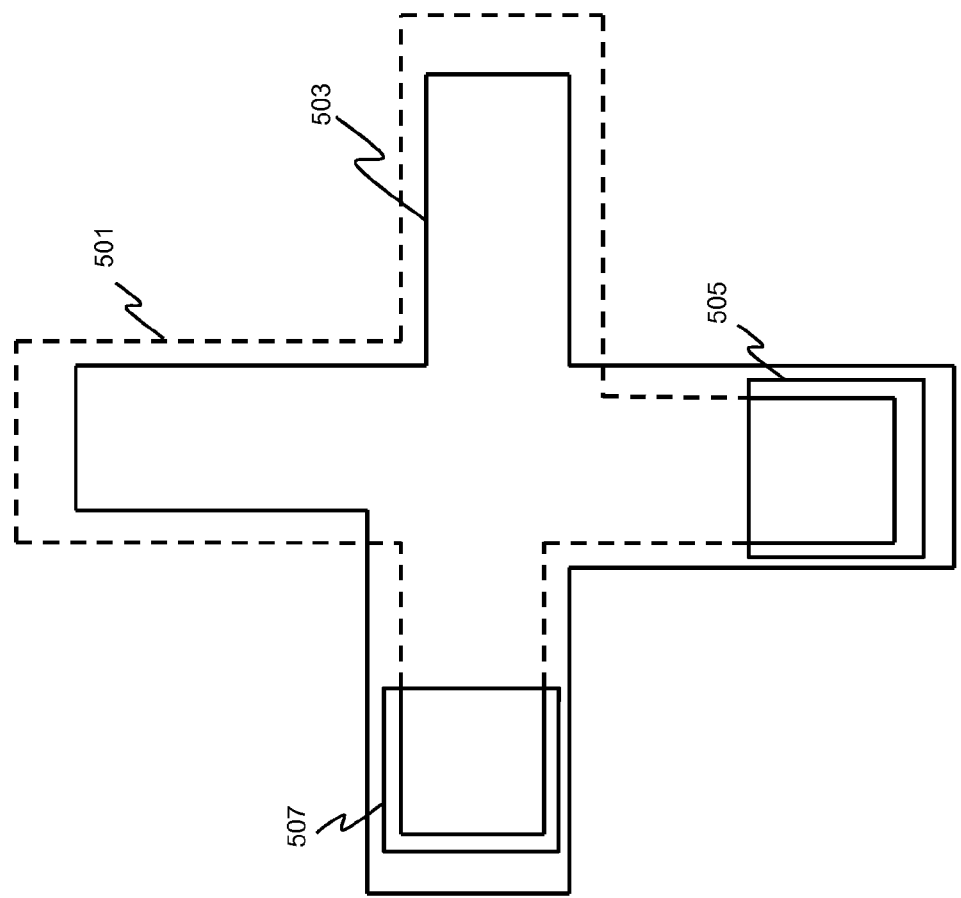

Adverting to FIG. 5, a monitoring structure for two directions overlay and registration monitoring of metal interconnect layers is illustrated. An initial metal monitoring structure 501 is formed similar to the initial metal monitoring structure 401 of FIG. 4, but having a second portion having third and fourth edges separated by a third distance in a second direction, a third portion having fifth and sixth edges separated by a fourth distance in the first direction, and a fourth portion having seventh and eighth edges separated by a fifth distance in the second direction. In particular, the initial metal monitoring structure 501 formed in a cross shape is formed in an initial metal layer of a semiconductor substrate, in an area that does not include IC patterns. A subsequent metal monitoring structure 503 is formed similar to the subsequent metal monitoring structure 403 of FIG. 4, but having a second portion having third and fourth edges separated by a sixth distance in the second direction, the sixth distance being greater than the third distance, a third portion having fifth and sixth edges separated by a seventh distance in the first direction, the seventh distance being less than the fourth distance, and a fourth portion having seventh and eighth edges separated by an eighth distance in the second direction, the eighth distance being less than the first fifth distance. In particular, the subsequent metal monitoring structure 503 formed in a cross shape is formed in a subsequent metal layer of the semiconductor substrate, in an area that does not include IC patterns. Thereafter, vias 505 and 507 are formed within the first and second portions of the subsequent metal monitoring structure 503, exposing the first and second edges of the first portion of the initial metal monitoring structure 501 and the third and fourth edges of the second portion of the initial metal monitoring structure 501, respectively. Again, as with FIG. 4, only the portions of the initial metal monitoring structure 501 within the vias 505 and 507 are visible as depicted by the solid lines. Also, similar to FIG. 4, this process flow may be repeated for each two consecutively formed metal layers.

The embodiments of the present disclosure can achieve several technical effects including providing structures for 2D registration measurement, overlay reticle measurement, and assessment of the direction of the overlay. More specifically, the change in overlap of the edges of the registration and overlay structures can be attributed to a sizing change or a placement change and adjustments made accordingly. In addition, the overlay measurement for the implant layer can be easily obtained in both the X and the Y direction for both reticle and wafer CDSEM. Further, where applicable, the present disclosure enables the monitoring of the BEOL interconnections as well as one or two direction SEM overlay measurements. The present disclosure enjoys industrial applicability in any of various types of highly integrated semiconductor devices, particularly for 45 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an active monitoring structure having first and second edges separated by a first distance in an active layer on a semiconductor substrate;
    forming a polysilicon (poly) monitoring structure having first and second edges separated by a second distance in a poly layer; and
    forming one or more contact monitoring structures in a contact layer, collectively exposing at least the first and second edges of each of the active and poly monitoring structures;
    wherein the active, poly, and contact monitoring structures are formed in an area which includes no integrated circuit (IC) patterns in the active, the poly, and the contact layers, respectively, the one or more contact monitoring structures comprise at least first, second, and third contact monitoring structures, the first and second contact monitoring structures expose the first and second edges of the active monitoring structure, and the second and third contact monitoring structures expose the first and second edges of the poly monitoring structure.

2. The method according to claim 1, wherein:
    the first and second distances are in different directions.

3. The method according to claim 1, further comprising:
    forming a second active monitoring structure in the active layer on a semiconductor substrate; and
    forming a second poly monitoring structure in the poly layer,
    wherein one of the first, second, and third contact monitoring structures exposes one of the first and second edges of each of the first active and first poly monitoring structures and exposes a first edge of each of the second active and second poly monitoring structures.

4. The method according to claim 3, further comprising:
    forming a fourth contact monitoring structure in the contact layer, exposing a second edge of the second active monitoring structure, opposite the first edge; and
    forming a fifth contact monitoring structure in the contact layer, exposing a second edge of the second poly monitoring structure, opposite the first edge.

5. The method according to claim 1, further comprising:
    forming a plurality of implant monitoring structures in an implant layer on the semiconductor substrate in an area which includes no IC patterns in the implant layer,
    wherein a first implant monitoring structure having first, second, third, and fourth edges is formed on top of either the active monitoring structure or the poly monitoring structure, and the first, second, third, and fourth edges are all exposed.

6. The method according to claim 1, wherein:
    the second distance is less than and in the same direction as the first distance;
    the active monitoring structure has third and fourth edges separated by a third distance in a third direction different than the first direction;
    the poly monitoring structure has third and fourth edges separated by a fourth distance less than and in the same direction as the third distance; and
    one contact monitoring structure exposes the first, second, third, and fourth edges of the active monitoring structure and first, second, third, and fourth edges of the poly monitoring structure.

7. A device comprising:
    a semiconductor substrate;
    an active layer including an active monitoring structure having first and second edges separated by a first distance;
    a poly layer including a poly monitoring structure having first and second edges separated by a second distance; and
    a contact layer including first, second, and third contact monitoring structures, collectively exposing at least the first and second edges of each of the active and poly monitoring structures,
    wherein the active monitoring structures, the poly monitoring structure, and the first, second, and third contact monitoring structures are in an area which includes no IC pattern in the active, the poly, and the contact layers, respectively, and
    wherein the first and second contact monitoring structures expose the first and second edges of the active monitoring structure and the second and third contact monitoring structures expose the first and second edges of the poly monitoring structure.

8. The device according to claim 7, further comprising:
    the active monitoring structure having first and second edges separated by the first distance in a first direction; and
    the poly monitoring structure having first and second edges separated by the second distance in a second direction that is different than the first direction.

9. The device according to claim 7, further comprising:
    a second active monitoring structure in the active layer on a semiconductor substrate; and
    a second poly monitoring structure in the poly layer,
    wherein one of the first, second, and third contact monitoring structures exposes one of the first and second edges of each of the first active and first poly monitoring structures and exposes a first edge of each of the second active and second poly monitoring structures.

10. The device according to claim 9, further comprising:
a fourth contact monitoring structure in the contact layer, exposing a second edge of the second active monitoring structure, opposite the first edge; and
a fifth contact monitoring structure in the contact layer, exposing a second edge of the second poly monitoring structure, opposite the first edge.

11. The device according to claim 7, further comprising:
a plurality of implant monitoring structures in an implant layer on the semiconductor substrate in an area which includes no IC patterns in the implant layer,
wherein a first implant monitoring structure having first, second, third, and fourth edges is formed on top of either the active monitoring structure or the poly monitoring structure and the first, second, third, and fourth edges are all exposed.

12. The device according to claim 7, wherein the second distance is less than and in the same direction as the first distance;
the active monitoring structure has third and fourth edges separated by a third distance in a third direction different than the first direction;
the poly monitoring structure has third and fourth edges separated by a fourth distance less than and in the same direction as the third distance; and
one contact monitoring structure exposes the first, second, third, and fourth edges of the active monitoring structure and first, second, third, and fourth edges of the poly monitoring structure.

* * * * *